US007467006B2

(12) United States Patent
Abe et al.

(10) Patent No.: US 7,467,006 B2
(45) Date of Patent: Dec. 16, 2008

(54) MAGNETIC RESONANCE IMAGING SYSTEM AND CONTRAST-ENHANCED ANGIOGRAPHY

(75) Inventors: Takayuki Abe, Matsudo (JP); Tetsuhiko Takahashi, Chiyoda-ku (JP)

(73) Assignee: Hitachi Medical Corporation, Tokyo (JP)

( * ) Notice: Subject to any disclaimer, the term of this patent is extended or adjusted under 35 U.S.C. 154(b) by 100 days.

(21) Appl. No.: 10/575,159

(22) PCT Filed: Oct. 5, 2004

(86) PCT No.: PCT/JP2004/014660

§ 371 (c)(1),
(2), (4) Date: Apr. 4, 2006

(87) PCT Pub. No.: WO2005/034749

PCT Pub. Date: Apr. 21, 2005

(65) Prior Publication Data

US 2007/0078333 A1    Apr. 5, 2007

(30) Foreign Application Priority Data

Oct. 7, 2003    (JP)    ............... 2003-347918

(51) Int. Cl.
*A61B 5/05*    (2006.01)
*A61B 6/00*    (2006.01)
*G01V 3/00*    (2006.01)

(52) U.S. Cl. ............ 600/420; 600/419; 600/431; 324/307; 324/309

(58) Field of Classification Search ............ 600/410, 600/420, 431; 324/307, 309, 318
See application file for complete search history.

(56) References Cited

U.S. PATENT DOCUMENTS 5,307,014 A * 4/1994 Laub .................. 324/306

(Continued)

FOREIGN PATENT DOCUMENTS

JP    2001-212108    8/2001

(Continued)

OTHER PUBLICATIONS

T. Masumoto et al., "Development of Intraarterial Contrast-enhanced 2D MRDSA with a 0.3 Tesla Open MRI System", Magnetic Resonance in Medical Sciences, Jul. 1, 2003, vol. 2, No. 2, p. 97-103.

*Primary Examiner*—Eric F Winakur
*Assistant Examiner*—Michael T Rozanski
(74) *Attorney, Agent, or Firm*—Cooper & Dunham, LLP

(57)    ABSTRACT

An MRI system capable of acquiring a high-quality blood vessel image even during a measuring period other than at an injected contrast medium concentration peak by always picking up an image under optimum conditions while following up with an injected contrast medium concentration that changes every moment in the body. A flip angle is changed according to a contrast medium concentration b(t) as shown by a curve (102). During a period (Da) where a contrast medium concentration b(t) gradually increases, a flip angle (FA) increases according to a contrast medium concentration b(t); and during a period (Db) where a contrast medium concentration b(t) gradually decrease, a flip angle is gradually decreased. If a flip angle is controlled so as to follow up with a contrast medium concentration b(t) and reach an Ernst's angle at which a single intensity is at a maximum, a high-quality blood vessel image can be acquired even during a measuring period other than at an injected contrast medium concentration peak.

22 Claims, 8 Drawing Sheets

U.S. PATENT DOCUMENTS

| | | | |
|---|---|---|---|
| 5,553,619 A * | 9/1996 | Prince | 600/420 |
| 6,198,960 B1 * | 3/2001 | Fain et al. | 600/419 |
| 6,381,486 B1 | 4/2002 | Mistretta et al. | |
| 6,611,144 B2 | 8/2003 | Abe | |
| 2003/0011368 A1 | 1/2003 | Abe | |

FOREIGN PATENT DOCUMENTS

| | | |
|---|---|---|
| JP | 2001-276016 | 10/2001 |
| JP | 2003-500132 | 1/2003 |
| WO | WO00/72032 A1 | 11/2000 |
| WO | WO01/75469 A1 | 10/2001 |

* cited by examiner

MAGNETIC RESONANCE IMAGING SYSTEM AND CONTRAST-ENHANCED ANGIOGRAPHY

TECHNICAL FIELD

The present invention relates to a magnetic resonance imaging system for taking an image of a desired area of an object to be examined by utilizing a nuclear magnetic resonance phenomenon, and more particularly to a technique for taking a high-quality blood vessel image with a contrast-enhanced angiography for imaging the running state of a vascular system by injecting a contrast agent.

BACKGROUND ART

A magnetic resonance imaging (abbreviated to "MRI" hereinafter) system measures a density distribution, a relaxation time distribution, etc. of nuclear spins (referred to simply as "spins" hereinafter) in a desired examination area of an object to be examined by utilizing a nuclear magnetic resonance (abbreviated to "NMR" hereinafter) phenomenon, and then displays an image of the object in an arbitrary section based on the measured data.

Some of MRI systems have the image-taking function called MR angiography (abbreviated to "MRA" hereinafter) adapted for imaging blood flows. The MRA image-taking function is practiced by two methods, i.e., one using no contrast agent and other using a contrast agent. Generally, the method using the contrast agent is more superior in capability of imaging blood vessels and is able to obtain a blood vessel image with higher quality.

A typical example of the method using the contrast agent is combined one of a T1-shortening contrast agent, such as Gd-DTPA, and a gradient echo sequence with a short TR (Repetition Time).

That combined method is intended to image the vascular lumen filled with the blood containing the contrast agent at a higher contrast than other tissues based on the fact that, because spins in a blood flow containing the T1-shortening contrast agent have shorter T1 than surrounding tissues, those spins are less apt to saturate even at the same TR and hence generate higher signals than the other tissues in the relative sense.

Blood vessels can be imaged by measuring data (three-dimensional in practice) of a volume including blood vessels for a short time during which the contrast agent remains in the blood vessels, and by executing a projection process, e.g., a maximum intensity projection process, while the measured three-dimensional images are superimposed with each other. Therefore, an image-taking sequence used in MRA is generally on the basis of a three-dimensional gradient echo process.

In order to obtain a satisfactory image with the three-dimensional contrast-enhanced MRA, the following three points are important, i.e., (1) injection manner of the contrast agent, (2) image-taking timing, and (3) setting of optimum imaging conditions (especially a flip angle or an excitation angle).

Regarding the first condition (1), the contrast agent has to be injected in such a manner as allowing the contrast agent to stably maintain a high concentration in blood vessels to be imaged. For that purpose, the contrast agent is generally quickly injected using an automatic injector.

Regarding the second condition (2), to selectively take an image of only the artery distinguished from others, the image-taking timing has to be set such that the concentration of the contrast agent is kept high in the artery at the time of collecting data.

In particular, it is ideal that a central portion (low frequency region) of the k-space, on which an image contrast depends dominantly, is measured in match with the timing at which the concentration of the contrast agent is peaked. The image-taking timing is set corresponding to a method of collecting data by a pulse sequence. The technique for setting the timing is disclosed in Patent Document 1 given blow.

Regarding the third condition (3), for the purposes of minimizing signal attenuation due to shortening of T2 caused by the contrast agent and phase dispersion caused by blood flows, TE time from excitation to echo center) is set to a value as short as possible (not longer than 3 ms), and TR is set to a relatively short time (not longer than 10 ms) within the allowable range of S/N depending on the injection speed of the contrast agent. In other words, a method of changing TR is modified following the concentration of the contrast agent.

Patent Document 1: U.S. Pat. No. 5,553,619

Regarding the third condition (3), in the known three-dimensional contrast-enhanced MRA, because since the gradient echo sequence with short TR is used, an optimum flip angle has to be set depending on the concentration of the contrast agent in the vascular lumen. Usually, the optimum flip angle is set to the Ernst's angle at the estimated concentration of the contrast agent, which corresponds to the time when the concentration of the contrast agent is peaked.

However, the concentration of the injected contrast agent in the vascular lumen is changed at every moment with time such that the concentration increases exponentially until reaching the peak and then decreases exponentially after reaching the peak. Thus, there is a problem that the optimum flip angle is given just at the concentration peak, and high signals cannot be obtained from blood flows over the entirety of a measurement period.

In the three-dimensional contrast-enhanced MRA of the related art, the image-taking conditions are optimized, including optimization of the flip angle, to be matched with the peak of the concentration of the contrast agent in the vascular lumen within a target area (see the techniques disclosed in Patent Document 1).

Stated another way, because the concentration of the contrast agent in the vascular lumen, which has been quickly intravenously injected through the vein, is changed at every moment with time, measurement in a time zone where the concentration of the contrast agent is peaked means that the measurement is optimized in point of maximizing the intensity of an echo signal.

However, the measurement in time zones before and after the zone corresponding to the peak of the concentration of the contrast agent cannot be regarded as satisfactory from the viewpoint of optimum measurement.

With the techniques disclosed in Patent Document 1, since the timing of acquiring data regarding the central portion of the k-space is matched with the peak of the concentration of the contrast agent in the vascular lumen within the target area, the measurement of the central portion of the k-space, which predominantly contributes to the image contrast, is optimized and high signals can be obtained in the central portion. With the techniques disclosed in Patent Document 1, however, the measurement of peripheral portions of the k-space, which predominantly contributes to the image contour (sharpness), is away from the optimum state, and therefore satisfactory high signals cannot be obtained in the peripheral portions.

SUMMARY

This disclosure provides an MRI system and a contrast-enhanced angiography, which can take an image under optimum conditions while following the concentration of a contrast agent injected into an object to be examined and changed at every moment with time, thereby obtaining a blood vessel image with higher quality.

This disclosure provides various aspects, including (but not limited to) the following.

Means for Solving the Problems

To solve the problems mentioned above, the present Invention is constituted as follows.

(1) In a contrast-enhanced angiography for taking an image of a blood vessel in an object to be examined with injection of a contrast agent by using a magnetic resonance imaging system, the angiography comprising the steps of (a) positioning a desired region of the object, including the blood vessel, within a static magnetic field space; (b) injecting the contrast agent into the object; (c) imaging the desired region in accordance with a predetermined pulse sequence including at least one imaging parameter; (d) reconstructing a blood vessel image from imaging data obtained in the imaging step; and (e) displaying the blood vessel image, wherein, in the imaging step (c), a value of the at least one imaging parameter in the pulse sequence is changed during the imaging depending on a concentration of the contrast agent in the blood vessel.

(2) In above (1), preferably, in the imaging step (c), a first period and a second period are set depending on the concentration of the contrast agent, and the imaging parameter has different values during the first period and the second period.

(3) In above (2), preferably, in the imaging step (c), at least two imaging parameters are selected, and a different imaging parameter for the first period and the second period is respectively selected.

(4) In above (3), preferably, a value of a first imaging parameter is changed during the first period, and a value of a second imaging parameters is changed during the second period.

(5) In above (1), preferably, the first period is a concentration increasing period until a time at which the concentration of the contrast agent is peaked, and the second period is a concentration decreasing period after the time at which the concentration of the contrast agent is peaked.

(6) In above (4), preferably, the first period is a higher concentration period in which the concentration of the contrast agent is not lower than a threshold, including the time at which the concentration of the contrast agent is peaked, and the second period is a lower concentration period in which the concentration of the contrast agent is lower than the threshold.

(7) In above (5), preferably, the pulse sequence is a gradient echo pulse sequence including a flip angle and a repetition time as the imaging parameters, a value of at least one of the flip angle and the repetition time is changed, the flip angle is increased following a concentration increase during the concentration increasing period and reduced following a concentration decrease during the concentration decreasing period, and the repetition time is reduced following the concentration increase during the concentration increasing period and increased following the concentration decrease during the concentration decreasing period.

(8) In above (6), preferably, the pulse sequence is a gradient echo pulse sequence including a flip angle and a repetition time as the imaging parameters, the first imaging parameter is one of the flip angle and the repetition time, the second imaging parameter is the other, the flip angle is set such that the flip angle has a larger value during the higher concentration period than a value during the lower concentration period, and the repetition time is set such that the repetition time has a shorter value during the higher concentration period than a value during the lower concentration period.

(9) In above (8), the value of the first imaging parameter is changed in opposite directions before and after the peak time, and the value of the second imaging parameter is monotonously increased or reduced.

(10) In above (7) to (9), preferably, the flip angle is changed such that the flip angle becomes an Ernst's angle, and the repetition time is changed such that the flip angle becomes an Ernst's angle.

(11) In above (1), preferably, the displaying step (e) displays statistic values obtained based on values resulting from changing the value of the imaging parameters.

(12) In above (1), preferably, in the imaging step (c), data regarding a central portion of a k-space is obtained near a time at which the concentration of the contrast agent is peaked.

(13) In above (1), preferably, the contrast-enhanced angiography further comprises, at any point in time between the positioning step (a) and the reconstructing step (d), (f) imaging the desired region in accordance with the same pulse sequence as that used in the imaging step (c), wherein, in the reconstructing step (d), the blood vessel image is obtained from difference between images taken in the two imaging steps (c) and (f).

(14) In above (1), preferably, the contrast-enhanced angiography further comprises, between the positioning step (a) and the injecting step (b), (g) injecting the contrast agent into the object and obtaining information regarding changes in the concentration of the contrast agent in the blood vessel, wherein, in the imaging step (c), start of the step (c) is instructed and the value of the imaging parameter is changed in accordance with the concentration change information.

(15) In above (1), preferably, the contrast-enhanced angiography further comprises, between the injecting step (b) and the imaging step (c), (h) successively taking monitoring images of the desired region including the blood vessel and instructing start of the imaging step (c), wherein the start instruction is issued when a signal representing information regarding the concentration of the contrast agent in the blood vessel is extracted from the monitoring images and the extracted signal exceeds a predetermined value.

(16) In above (1), preferably, in the imaging step (c), values of different kinds of imaging parameters are changed during the imaging.

(17) In above (1), preferably, in the imaging step (c), a manner of changing the value of the imaging parameter is modified during the imaging.

(18) In a magnetic resonance imaging system comprising static magnetic field generating means for applying a static magnetic field to an object to be examined, gradient magnetic field generating means for applying a gradient magnetic field, RF magnetic field transmitting means for irradiating, to nuclear spins within the object, RF magnetic field pulses to cause nuclear magnetic resonance of the nuclear spins, an echo signal receiving means for detecting an echo signal emitted by the nuclear magnetic resonance, pulse sequence control means for controlling a pulse sequence including at least one imaging parameter and executed to receive the echo signal, signal processing means for reconstructing an image of a blood vessel by using the echo signal detected by the echo signal receiving means, and display means for displaying the blood vessel image, wherein, during execution of the pulse sequence, the pulse sequence control means changes a value of the at least one imaging parameter in the pulse sequence depending on a concentration of a contrast agent, which has been injected into the object, in the blood vessel.

(19) In above (18), preferably, the signal processing means estimates the concentration of the contrast agent based on information regarding changes in the concentration of the contrast agent, the information being obtained in advance, and the pulse sequence control means takes the blood vessel image in accordance with a predicted value of the concentration of the contrast agent.

(20) In above (19), preferably, the magnetic resonance imaging system further comprises an input unit for receiving an input to instruct start of the imaging of the blood vessel image, wherein the pulse control means successively takes monitoring images including the blood vessel, the display means successively displays the monitoring images, and the pulse sequence control means switches over the imaging from the monitoring images to the blood vessel image in accordance with the start instruction.

(21) In above (18), preferably, the magnetic resonance imaging system further comprises contrast agent injecting means, the contrast agent being injected by the contrast agent injecting means.

It will be apparent from reading this disclosure a contrast-enhanced angiography can be realized which can always take an image under optimum conditions following the concentration of the contrast agent injected into the object and changed at every moment with time, thereby obtaining a blood vessel image with higher quality.

It will be apparent from reading this disclosure a contrast-enhanced angiography can be realized which can always take an image under optimum conditions following the concentration of the contrast agent injected into the object and changed at every moment with time, thereby obtaining a blood vessel image with higher quality.

Also, an MRI system can be provided for carrying out the contrast-enhanced angiography.

Further, in the contrast-enhanced angiography using the contrast agent, i.e., in the three-dimensional contrast-enhanced MRA, it is possible, by applying the subject matter of this disclosure, to perform the measurement while optimizing image-taking conditions following the concentration of the contrast agent changed at every moment with time in the vascular lumen, in particular, while optimizing the flip angle and the repetition time TR, thereby obtaining high signals from the vascular lumen all over the measurement window.

REFERENCE NUMERALS

1 ... object, 2 ... static magnetic field generating system, 3 ... gradient magnetic field generating system, 4 ... sequencer, 5 ... transmitting system, 6 ... receiving system, 7 ... signal processing system (signal operation/processing means), 8 ... CPU (signal operation/processing means), 9 ... gradient magnetic field coils, 10 ... gradient magnetic field power supplies, 11 ... RF oscillator, 12 ... modulator, 13 ... RF amplifier, 14a ... transmitting-side RF coil, 14b ... receiving-side RF coil, 15 ... amplifier, 16 ... quadrature phase detector, 17 ... A/D converter, 18 ... magnetic disk, 19 ... optical disk, and 20 ... display

BEST MODE FOR CARRYING OUT THE INVENTION

Embodiments of the present invention will be described below with reference to the drawings.

Note that, in all the drawings for explaining the embodiments of the present invention, components having the same functions are denoted by the same symbols and a repetitive description of those components is omitted.

Figure 1:
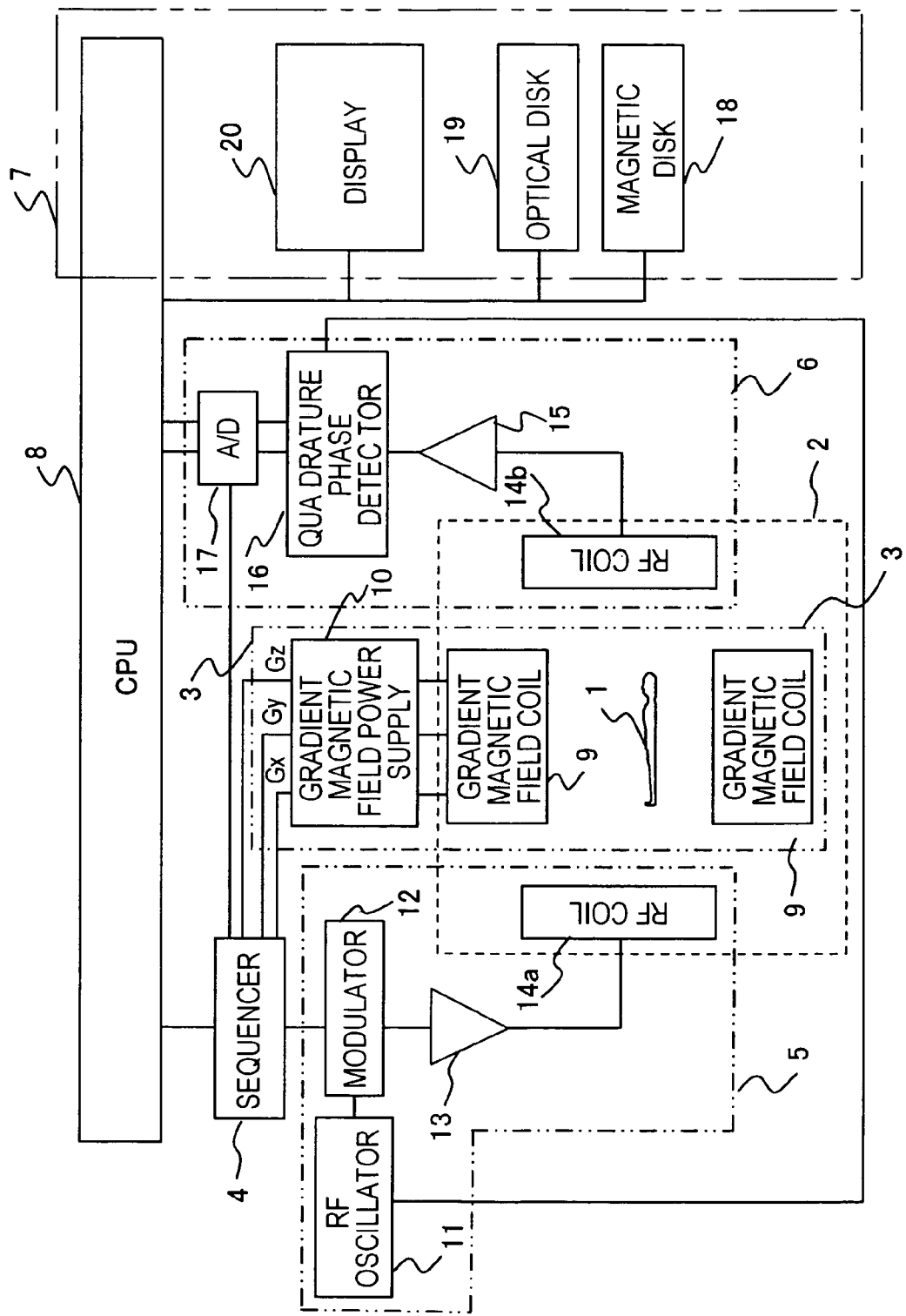
FIG. 1 is a block diagram showing a schematic overall configuration of an MRI system to which the present invention is applied.

FIG. 1 is a block diagram showing a schematic overall configuration of one embodiment of an MRI system to which the present invention is applied.

The illustrated MRI system is intended to obtain a cross-sectional image of an object to be examined by utilizing the MR phenomenon. As shown in FIG. 1, the MRI system comprises a static magnetic field generating system 2, a gradient magnetic field generating system 3, a transmitting system 5, a receiving system 6, and a signal processing system 7, a sequencer 4, and a central processing unit (CPU) 8.

The static magnetic field generating system 2 generates a uniform static magnetic field in a space around an object to be examined 1 in the direction of a body axis or the direction perpendicular to the body axis. A magnetic field generating means of the permanent magnet type, the resistive type or the super-conducting type is disposed around the object 1.

The gradient magnetic field generating system 3 comprises gradient magnetic field coils 9 wound in 3-axis directions X, Y and Z, and gradient magnetic-field power supplies 10 for driving the gradient magnetic field coils 9, respectively. The gradient magnetic-field power supplies 10 for the respective coils are driven in accordance with commands from the sequencer 4 (described later) so that gradient magnetic fields Gz, GY and Gx in the 3-axis directions X, Y and Z are applied to the object 1.

More specifically, a slice-selective gradient magnetic field pulse (Gz) is applied in one of the directions X, Y and Z to set a slice plane in the object 1. A phase-encoding gradient magnetic field pulse (GY) and a frequency-encoding gradient magnetic field pulse (Gx) are applied in the two remaining directions, whereby position information in the respective directions is encoded in an echo signal.

The sequencer 4 is a control means for repetitively applying a radio-frequency magnetic field pulse (referred to as an "RF pulse" hereinafter) and a gradient magnetic field pulse in a certain predetermined sequence. The sequencer 4 is operated under control of the CPU 8 and transmits various commands required for collecting data of a cross-sectional image of the object 1 to the transmitting system 5, the gradient magnetic field generating system 3 and the receiving system 6.

Further, in the MRI system according to the embodiment of the present invention, the sequencer 4 includes a means capable of performing measurement while changing an output of the RF pulse.

The transmitting system 5 irradiates the RF pulse to the object 1 to cause nuclear magnetic resonance of nuclear spins in atoms that constitute the physiological tissues of the object 1. The transmitting system 5 comprises an RF oscillator 11, a modulator 12, an RF amplifier 13, and a transmitting-side RF coil 14a.

The RF pulse outputted from the RF oscillator 11 is modulated in amplitude by the modulator 12 at the timing commanded from the sequencer 4. The RF pulse having the modulated amplitude is amplified by the RF amplifier 13 and then supplied to the RF coil 14a disposed near the object 1, whereupon the RF pulse is irradiated to the object 1.

The receiving system 6 detects an echo signal (NMR signal) emitted from nuclear spins in atoms that constitute the physiological tissues of the object 1 by nuclear magnetic resonance. The receiving system 6 comprises a receiving-side RF coil 14b, an amplifier 15, a quadrature phase detector 16, and an A/D converter 17.

A responsive MR signal induced by the RF pulse irradiated from the transmitting-side RF coil 14a and produced from the object 1 is detected by the RF coil 14b disposed near the object 1. The detected MR signal is amplified by the amplifier 15 and then divided into signals in two quadrature lines by the quadrature phase detector 16 at the timing commanded from the sequencer 4. Those signals are converted to digital values by the A/D converter 17 and are sent to the signal processing system 7.

The signal processing system 7 comprises external memories such as an optical disk 19 and a magnetic disk 18, and a display 20 constituted as, e.g., a CRT. When the data from the receiving system 6 is inputted to the CPU 8, the CPU 8 executes signal processing and other processing such as image rendering, and displays a processing result, i.e., the cross-sectional image of the object 1, on the display 20. Also, the CPU 8 records the processing result in the external memories, such as the magnetic disk 18.

Additionally, in FIG. 1, the transmitting- and receiving-side RF coils 14a, 14b and the gradient magnetic field coil 9 are arranged in a static magnetic field space, which is created by the static magnetic field generating system 2 and accommodates the object 1, in facing relation to the object 1.

Figure 5:
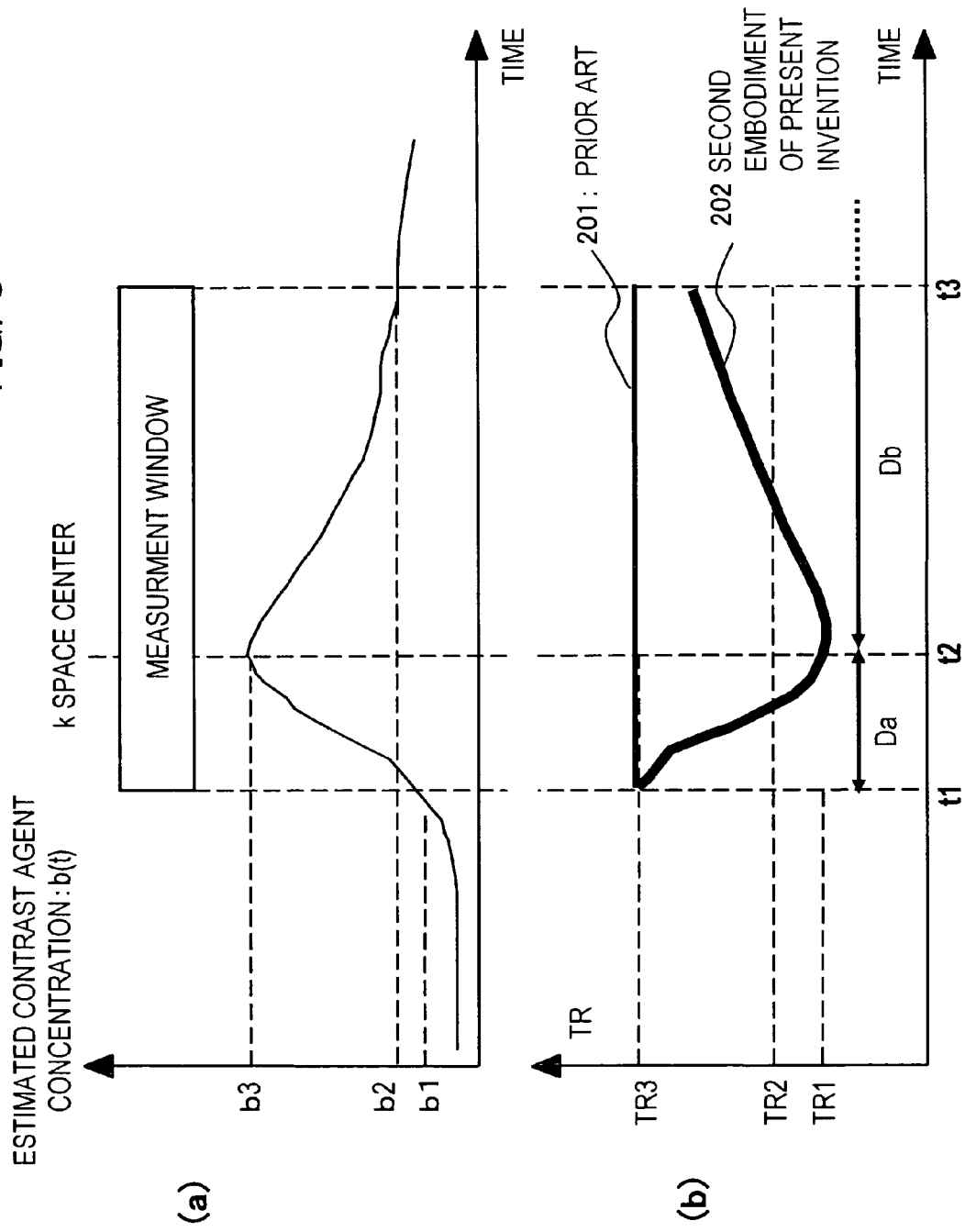
FIG. 5 is a chart for explaining TR control in the contrast-enhanced MRA according to a second embodiment of the present invention.

Moreover, the MRI system according to the embodiment of the present invention includes a contrast agent injecting means such as disclosed, by way of example, in FIGS. 5A and 5B of U.S. Pat. No. 5,553,619.

At present, the nucleus clinically prevailed as a target to be imaged by MRI systems is a hydrogen nucleus (proton) that is a primary constituent substance of the object. The shapes or functions of the head, the abdomen, the legs and arms, etc. of a human body are two- or three-dimensionally imaged by obtaining information regarding a spatial distribution of proton density and a spatial distribution of the relaxation time of an excited state, and by processing the information into an image.

An imaging method in the MRI system according to the embodiment of the present invention will be described below.

Figure 6:
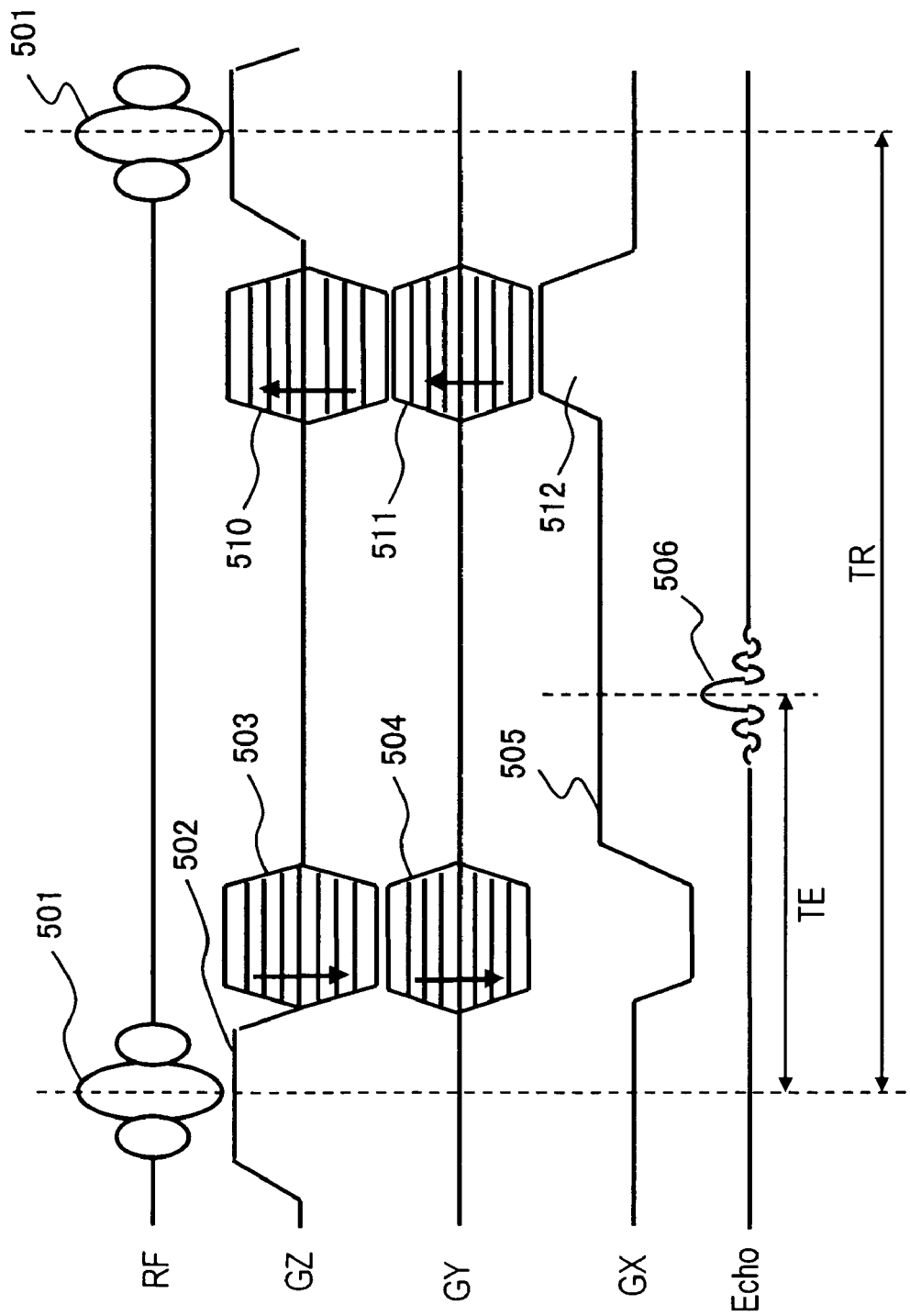
FIG. 6 is a schematic chart for explaining a known three-dimensional gradient echo sequence.

FIG. 6 shows a gradient echo pulse sequence based on the orthogonal sampling method. RF, Gz, GY, Gx and Echo shown in FIG. 6 represent respective axes of the RF pulse, the slide gradient magnetic field, the phase-encoding gradient magnetic field, and the frequency-encoding gradient magnetic field, and the echo signal. Also, 501 denotes the RF pulse, 502 the slice-selective gradient magnetic field pulse, 503 a slice-encoding gradient magnetic field pulse, 504 the phase-encoding gradient magnetic field pulse, 505 the frequency-encoding gradient magnetic field pulse, and 506 denotes the echo signal.

In three-dimensional imaging, per short repetition time TR (e.g., not longer than 10 ms), the RF signal 501 is applied to select a three-dimensional volume while applying the slice-selective gradient magnetic field pulse 502. Thereafter, the slice-encoding gradient magnetic field pulse 503 and the phase-encoding gradient magnetic field pulse 504 are applied in varying slice encode amounts and varying phase encode amounts while changing respective amounts by which those pulses are applied (i.e., areas defined by the waveforms of the gradient magnetic field pulses and the time base). Then, the echo signal 506 is detected while the frequency-encoding gradient magnetic field is applied to give the echo signal 506 with position information in the 3-axis directions.

By repeating the above-described operation in number of times of (slice encode number × phase encode number), the echo signals necessary for rendering a three-dimensional image are obtained. A value of 8, 16, 32, 64, etc. is selected as the slice encode number, and a value of 64, 128, 256, 512, etc. is selected as the phase encode number per image in usual cases.

Each echo signal is usually obtained as a time serial data made up of 128, 256, 512 or 1024 sampling data. These data are subjected to the three-dimensional Fourier transform, to thereby form a three-dimensional image.

After measuring the echo signals, a gradient magnetic field 510 having the reversed polarity to the slice-encoding gradient magnetic field 503 and a gradient magnetic field 511 having the reversed polarity to the phase-encoding gradient magnetic field 504 are applied, by way of example, as shown in FIG. 6 so that the applied slice encode amount and the applied phase encode amount are canceled to 0 (zero) during TR. Simultaneously, a spoiler 512 for dispersing the transverse magnetization is applied in the frequency encoding direction.

In addition, the phase of the RF pulse 501 is also changed by a certain amount per application thereof. As a result, the amount of the gradient magnetic field applied during TR is held constant for each axis. Therefore, when the repetition time TR is shorter than relaxation times T1 and T2 of magnetization in an area as an imaging target, the magnetization in that area is held in a steady state.

However, because the spoiler 512 is applied in the frequency encoding direction such that the applied gradient magnetic field amount in the frequency encoding direction is not canceled to 0 (zero) during TR, the image is obtained as one having a T1-weighted contrast with no T2-weighting. The reason resides in avoiding a risk that, if the applied gradient magnetic field amount in the frequency encoding direction is also canceled to 0 (zero) during TR, the image is obtained as a T2-weighted image having image quality not suitable for the contrast-enhanced MRA.

While the gradient magnetic fields 510, 511 each having the reversed polarity are applied in FIG. 6 so that the slice encode amount and the phase encode amount are canceled to 0 (zero) during TR, the gradient magnetic fields 510, 511 may be applied depending on the gradient magnetic fields 503, 504, respectively, so that the slice encode amount and the phase encode amount are not canceled to 0 (zero), but they have certain values during TR like the frequency encoding gradient magnetic field. This modification can also achieve a steady state and provide a T1-weighted image suitable for the contrast-enhanced MRA.

Because of blood flows being an imaging target, a gradient magnetic field, called Gradient Moment Nulling, may be added so as to rephase the dephasing caused by the blood flows. However, the Gradient Moment Nulling is not essential in the present invention, and a simple gradient echo is rather preferable from the viewpoint of shortening TR/TE.

Prior to a detailed description of the contrast-enhanced MRA using the MRI system of the present invention, the contrast-enhanced MRA will be briefly described below. As mentioned in Background Art, an image of blood containing a contrast agent can be taken with high signals by combining a T1-shortening contrast agent, such as Gd-DTPA, and a gradient echo sequence with a short TR. In the case imaging thin blood vessels, however, a sufficient contrast cannot be often obtained with respect to other tissues than the blood vessels.

For that reason, there is known a method of executing a differentiation process between images before and after the contrast enhancement so as to erase the other tissues than the blood vessels. This method is called, for example, 3DMR-DSA (Digital Sub Traction Angiography).

Also, as well known, a blood circulation system in a physiological body operates such that blood expelled out of the heart flows from the arteries through various tissues, returns to the veins, and then circulates from the heart to the lungs. Accordingly, after injecting the contrast agent from the elbow artery, blood expelled out of the heart is first imaged when it flows through the artery system and is then imaged when it flows through the vein system.

In clinical diagnosis on the condition of a disease, because of the necessity of imaging not only the artery system, but also the vein system in not a few cases, it is often desired to continuously perform measurement with the contrast-enhanced MRA over a plurality of phases for imaging of both the artery and vein systems. Such an imaging method is called dynamic MRA.

Those various types of contrast-enhanced MRA are described in detail in the paper, "3D Contrast MR Angiography", 2nd edition, Prince MR, Drist TM an Debatin JF, Springer PP3-39, 1988. In particular, 3DMR-DSA is described in P16-P19 of the paper.

On the basis of the above description of the contrast-enhanced MRA, one embodiment of the contrast-enhanced MRA using the MRI system of the present invention will be described below with reference to FIGS. 1-5.

First, the object 1 is positioned in a measurement space defined in the static magnetic field generating system, and an imaging area including an objective blood vessel is decided. Then, timing-measuring imaging is performed to detect the timing at which the concentration of the contrast agent is peaked in the objective blood vessel.

Regarding the timing-measuring imaging, the following two methods (M-1) and (M-2) are described in the above-cited paper, "3D Contrast . . . ".

(M-1) Test Injection Method: A small amount (about 1-2 ml) of the contrast agent is injected into the object 1 for a test to obtain a time-signal curve in the target area, and the time at which the contrast agent arrives the target area is measured from the obtained time-signal curve. Then, main imaging is performed based on the measured result. In other words, the main imaging is started after the time required for the contrast agent to arrive the target area has lapsed from the injection of the contrast agent for the main imaging.

Because the contrast agent is injected prior to the main imaging, this method (M-1) causes contrast enhancement of background tissues to some extent. However, such a problem is at a negligible level and the merit resulting from measuring the timing for the main imaging is more valuable. When using this method (M-1), the main imaging is performed after an appropriate time has lapsed from the injection for measuring the timing.

(M-2) Fluoroscopic Trigger Method: A region of interest (ROI) is set to a particular area in a monitor region, and signal changes in the ROI are measured while continuously imaging the particular area in real time (i.e., fluoroscopic imaging). At the time when the signal value in the ROI exceeds a preset threshold, the main imaging of the objective area is automatically started (this manner is called automatic trigger).

Alternatively, at the time when an appropriate signal rise is observed while continuously imaging the objective blood vessel in real time, the start of the main imaging of the objective blood vessel is instructed via a user interface, such as a keyboard, (this manner is called manual trigger).

One of those two manners, i.e., the manner (automatic trigger) of starting the main imaging at the time when the signal value exceeds the preset threshold and the manner (manual trigger) of instructing the start of the main imaging at the time when the appropriate signal rise is observed, is usable depending on cases.

In the fluoroscopic trigger method, the main imaging is performed immediately after obtaining the timing to take an image.

In any case using either the method (M-1) or (M-2), an image before the contrast enhancement is also taken in the main imaging, and the differential between the images after and before the contrast enhancement is obtained. Further, in the main imaging, the measurement is continuously performed at the same slice or slab position (the term "slab" meaning an imaging region in the slice direction in the three-dimensional imaging) under the same conditions.

The imaging sequence for the timing-measuring imaging and the imaging sequence for the main imaging can be any desired sequence, and is not limited to particular one. It is preferable, by way of example, to employ a sequence based on the two-dimensional gradient echo process in the timing-measuring imaging, and a sequence based on the three-dimensional gradient echo process in the main imaging.

A sequence for measuring the echo signals in the k-space (measurement space) will be described below.

Based on the arrival time of the contrast agent to the objective blood vessel, which has been obtained with the timing-measuring imaging, the measurement is started such that data regarding the central portion of the k-space is measured when the concentration of the contrast agent in the objective blood vessel is peaked.

The method of scanning the k-space in the measurement may be sequential or centric.

In the two-dimensional measurement, the sequential k-space scanning method is performed such that the echo signals are continuously obtained in order from one high spatial-frequency-side end toward the other high spatial-frequency-side end in the ky-axis (phase encoding) direction of the k-space. Assuming the number of phase encodes to be 256, for example, the echo signals are obtained in order of ky=−128→+127.

On the other hand, the centric k-space scanning method is performed such that the echo signals are continuously obtained in order from the central portion of the k-space (i.e., the low spatial frequency region) toward the high spatial frequency side. Assuming the number of phase encodes to be 256, for example, the echo signals are obtained alternately from the positive and negative sides of the k-space in order of ky=0, −1, +1, −2, +2, . . . , +127, −128.

Data in the central region of the k-space (i.e., in a low spatial frequency region) dominantly decides the contrast of an image, and data in a high spatial frequency region dominantly decides the contour (sharpness) of an image.

In the three-dimensional measurement, a kz-axis corresponding to the slice encode is added to the two-dimensional k-space. The above-described sequential or centric k-space scanning method in the ky-axis can also be applied to the scanning in the kz-axis.

Setting of optimum imaging conditions in the contrast-enhanced MRA according to the present invention will be described below.

As a first embodiment of the present invention regarding the setting of optimum imaging conditions, optimum setting of a flip angle is first described. In the first embodiment of the present invention, the flip angle is controlled such that the intensity of the echo signal is increased following changes in the concentration of the contrast agent in the blood vessel within the objective area. In particular, the echo signal is measured while controlling the flip angle such that the flip angle becomes equal or close to an Ernst's angle.

To being with, a description is made of a general theory regarding changes in the concentration of the contrast agent with time.

Generally, a maximum concentration of the contrast agent, which has been injected from the vein and resides in the artery phase, is approximately estimated based on the following formula (1) (see the above-cited paper, "3D Contrast . . . ":

maximum concentration=(concentration of undiluted contrast agent (mmol/ml)×injection rate of contrast agent (ml/s))/(cardiac output (ml/s))    (1)

The cardiac output of an ordinary adult is about 5.5 l/minute, i.e., about 97 ml/s, and the concentration of the undiluted contrast agent is 500 mmol/ml. In the case injecting the contrast agent at a rate of 1 ml/s, therefore, the maximum concentration (concentration at the peak) of the contrast agent in the artery phase is estimated as about 5 mmol/ml.

Figure 2:
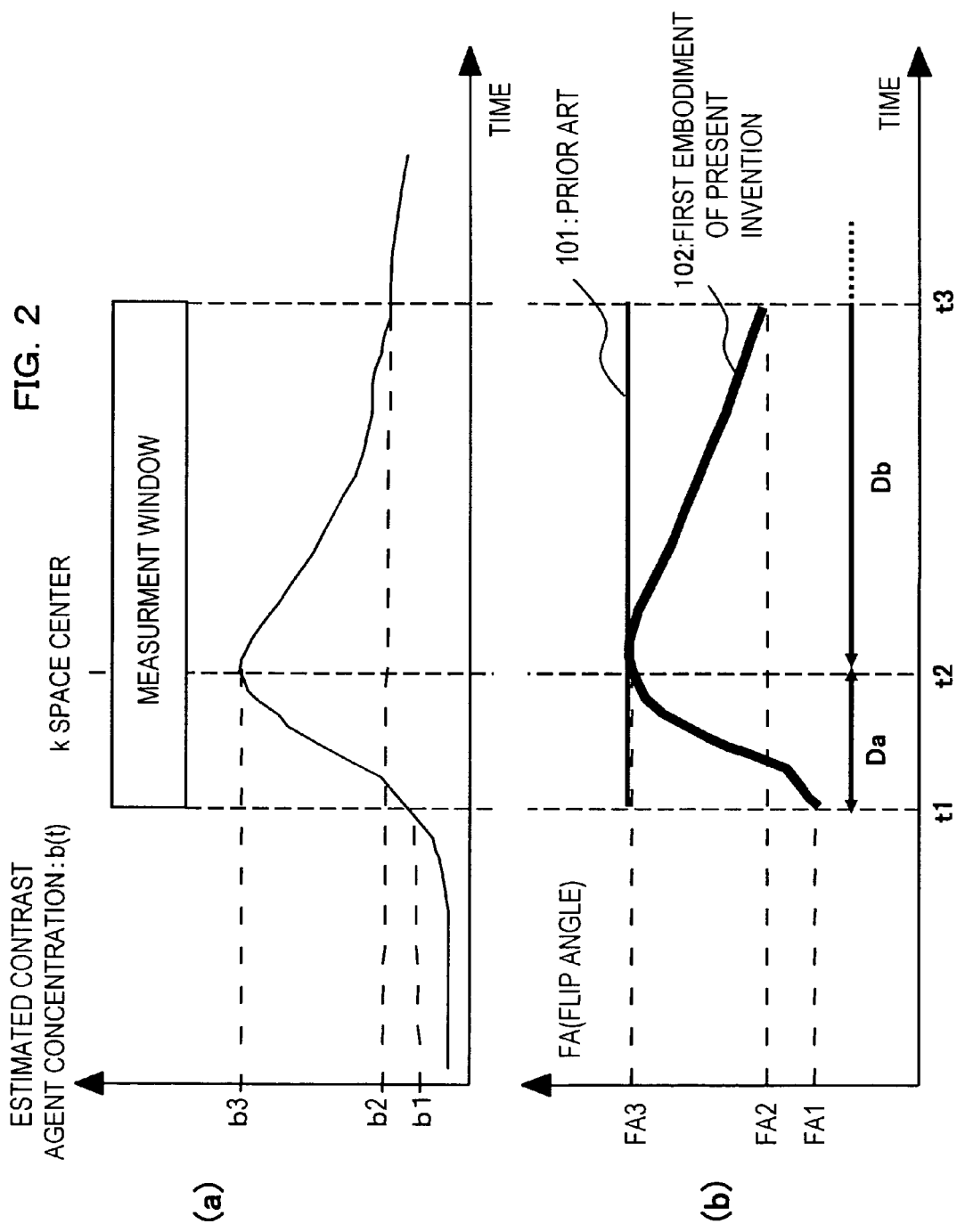
FIG. 2 is a chart for explaining control of a flip angle in the contrast-enhanced MRA performed by the MRI system according to the present invention.

Also, time-dependent concentration in the blood vessel after the injection of the contrast agent are varied with time, by way of example, as shown at (a) in FIG. 2. Such a time-dependent change b(t) is estimated base on the following formula (2):

$$b(t) = C_1(t+2\tau_1)^2 \exp(-t/\tau_1) + C_2 t^2 \exp(-t/\tau_2) \quad (2)$$

In the above formula (2), t represents the time lapsed from the injection of the contrast agent into the object, and $\tau_1$, $\tau_2$, $C_1$ and $C_2$ are constants. For example, $\tau_1$=4.7 s, $\tau_2$=2.4 s, and $C_2/C_1$=0.37 are usable.

The concentration of the contrast agent at an arbitrary lapsed time is computed and estimated by the CPU 8, shown in FIG. 1, based on the above formula (2).

In practice, however, those constants are varied to some extent depending on individual test bodies. For that reason, respective values of the constants $\tau_1$, $\tau_2$, $C_1$ and $C_2$ may be decided, for example, from the actual changes in the concentration of the contrast agent (i.e., changes of the signal intensity at respective lapsed times) per object, which are obtained by the test imaging performed using the test injection method (M-1) prior to the main imaging.

When the constant values are decided from the results of the test imaging, a plurality of images obtained by the test imaging and representing the changes in the concentration of the contrast agent are temporarily stored in, e.g., the external memory of the signal processing system 7.

Then, after the end of the test imaging, those images are analyzed by the CPU 8 to determine the respective constants in the above formula (2) of b(t) representing the concentration changes, and the determined results are stored in, e.g., the external memory.

At the time of performing the main imaging after the test imaging, the concentration of the contrast agent at an arbitrary lapsed time is computed and estimated by the CPU 8 based on the above formula (2) using the constants stored in the external memory.

Further, a T1 value of the vascular lumen, into which the contrast agent has been injected, can be computed based on the following formula (3):

1/T1 (after contrast enhancement)=1/T1 (before contrast enhancement)+(relaxation rate of contrast agent)×(concentration of contrast agent)    (3)

By using the contrast agent concentration b(t), which has been estimated based on the formula (2), as the term of (concentration of contrast agent) in the formula (3), the T1 value of the vascular lumen after the contrast enhancement can be estimated with respect to the time-dependent changes in the concentration of the contrast agent.

Additionally, in the gradient echo process, the flip angle for maximizing the echo signal is called an Ernst's angle. Such an Ernst's angle $\alpha$ can be computed based on the following formula (4):

$$\cos \alpha = \exp(-TR/T1) \quad (4)$$

In the above formula (4), TR-represents the repetition time and T1 represents the T1 value of the vascular lumen.

Figure 3:
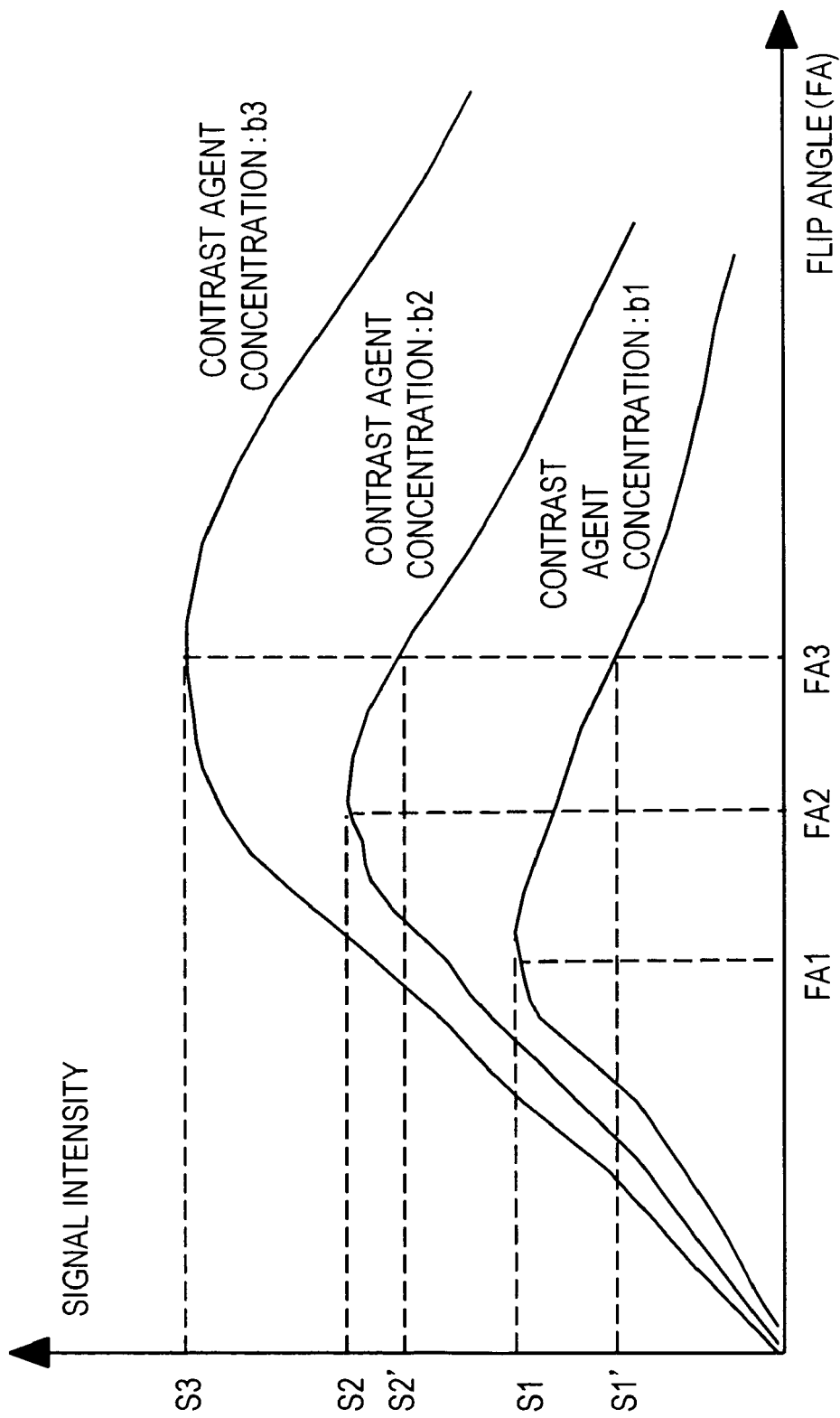
FIG. 3 is a graph showing curves representing signal intensity versus flip angle at various concentrations of a contrast agent.
Figure 4:
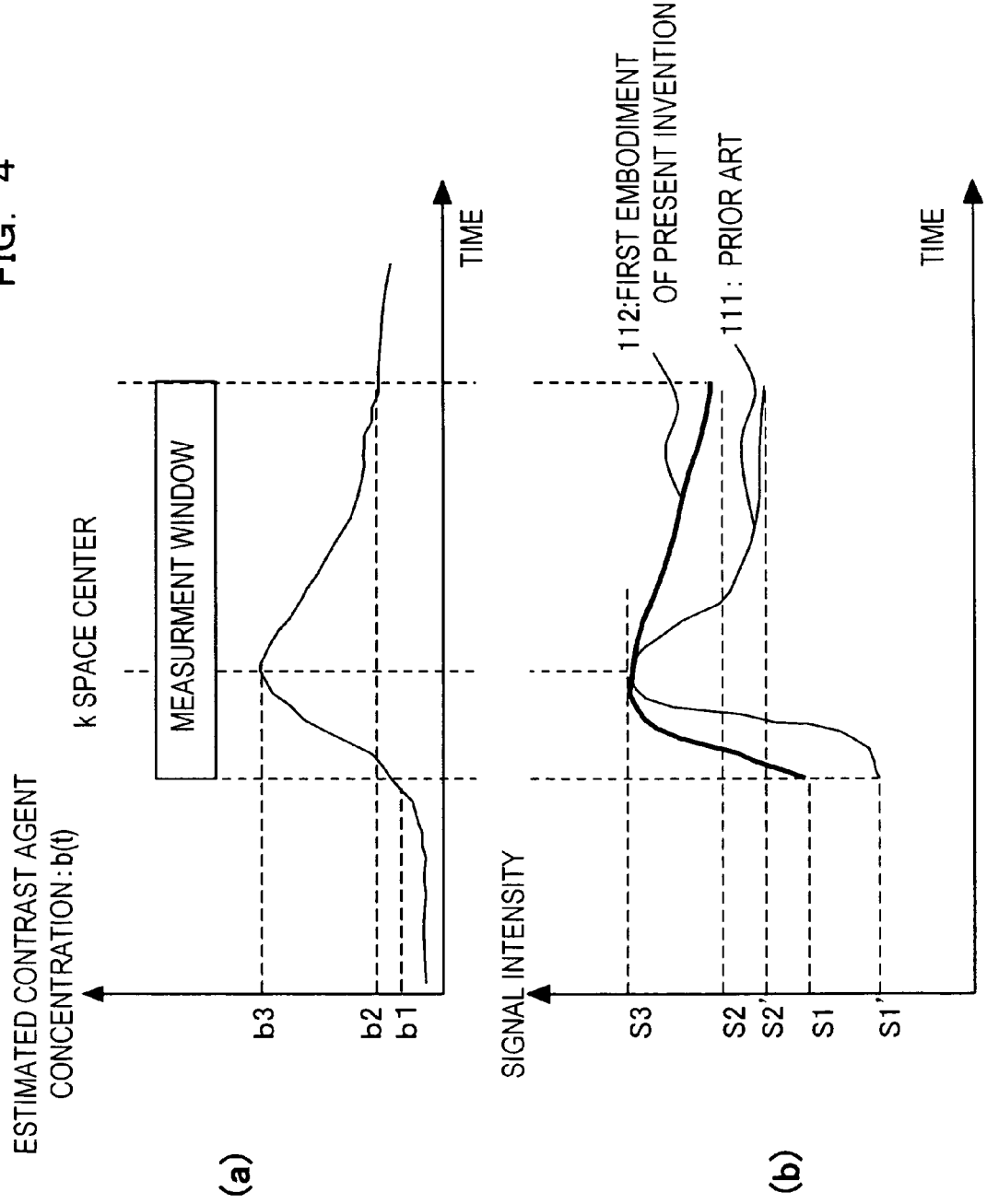
FIG. 4 is a chart for explaining the signal intensity obtained with the contrast-enhanced MRA according to a first embodiment of the present invention.

FIG. 3 is a graph showing the relationship between the flip angle (horizontal axis) and the signal intensity (vertical axis) when the concentration value of the contrast agent is changed. The flip angle at which the signal intensity is maximized is the Ernst's angle FA.

In an example shown in FIG. 3, the Ernst's angle for a contrast agent concentration b3 is FA3, the Ernst's angle for a contrast agent concentration b2 is FA2, and the Ernst's angle for a contrast agent concentration b1 is FA1. The contrast agent concentration is lowest at b1 and is highest at b3, whereas the Ernst's angle is minimum at FA1 and maximum at FA3. The signal intensity is changed such that a signal intensity S1 at the Ernst's angle FA1 for the contrast agent concentration b1 is smaller than a signal intensity S2 at the Ernst's angle FA2 for the contrast agent concentration b2, and the signal intensity S2 is smaller than a signal intensity S3 at the Ernst's angle FA3 for the contrast agent concentration b3.

As seen from the results shown in FIG. 3, the T1 shortening effect is enhanced as the concentration of the contrast agent increases. Correspondingly, T1 in the formula (4) is reduced and so is $\cos \alpha$, whereby the Ernst's angle $\alpha$ is increased.

Based on the foregoing general theory, by using, as T1 in the formula (4), the estimated T1 value after the contrast enhancement which has been computed from the formula (3), the Ernst's angle can be estimated following changes in the concentration of the contrast agent in the blood vessel within the objective area after the injection of the contrast agent into the object. In other words, the flip angle for maximizing the signal intensity can be estimated following the concentration of the contrast agent.

In the first embodiment of the present invention, the method of estimating the flip angle, which maximizes the signal intensity, following the concentration of the contrast agent is applied to measurement with the three-dimensional contrast-enhanced MRA. More specifically, the actual flip angle is controlled so as to provide the time-dependent change α(t) of the flip angle, which is computed based on the above formula (4), etc.

By controlling the flip angle in such a manner, the measurement can be performed at respective flip angles, which are optimum for maximizing the intensities of the detected signals, following the concentration of the contrast agent changed with time. Thus, a blood vessel image with higher quality can be obtained.

FIG. 2(b) is a graph showing how the flip angle is controlled following the time-dependent change b(t) of the estimated contrast agent concentration b shown in FIG. 2(a). In FIG. 2(b), the vertical axis represents the flip angle (FA1-FA3), and the horizontal axis represents the lapsed time t common to the graph of FIG. 2(a).

In FIG. 2(b), a curve 102 represents an example in which the flip angle is changed following the concentration of the contrast agent according to the first embodiment of the present invention, whereas a straight line 101 represents an example in which the flip angle is fixed to, e.g., FA3, regardless of changes in the concentration of the contrast agent unlike the present invention.

As shown in FIG. 2(b), the flip angle is changed such that the flip angle is increased (FA1→FA2→FA3) following the concentration of the contrast agent during a period Da (from time t1 to t2) in which the concentration of the contrast agent is gradually increased in accordance with α(t) computed based on the formula (4). During a period Db (from time t2 to t3) in which the concentration of the contrast agent is gradually decreased after reaching the peak, the flip angle is gradually reduced (FA3→FA2) following the decreasing concentration of the contrast agent. Stated another way, the manner of changing the flip angle is modified following the concentration of the contrast agent.

Practical control of the flip angle is executed by the sequencer 4 shown in FIG. 1. More specifically, the CPU 8 estimates the concentration of the contrast agent at an arbitrary lapsed time by using the respective constants in the formula (2), which have been obtained from, e.g., the external memory of the signal processing system 7, and then determines the T1 value of the desired vascular lumen after the contrast enhancement by putting the estimated value in the formula (3). Thereafter, the CPU 8 computes the Ernst's angle based on the formula (4) by using the determined T1 value, and informs the computed Ernst's angle to the sequencer 4.

The sequencer 4 controls the RF oscillator 11, the modulator 12, and the RF amplifier 13 in the transmitting system 5 so that the RF pulse corresponding to the Ernst's angle informed from the CPU 8 is applied to the object from the transmitting-side RF coil 14a.

FIGS. 4(a) and 4(b) show one example of the signal intensity obtained when the flip angle is controlled following the concentration of the contrast agent. FIG. 4(a) shows changes in the concentration of the contrast agent with time, and FIG. 4(b) shows changes of the signal intensity with time, which are resulted when the flip angle is always changed following the changes in the concentration of the contrast agent in the blood vessel, as shown in FIG. 2(b), so that the flip angle always takes a value close to the Ernst's angle.

In FIG. 4(b), a curve 111 represents the changes of the signal intensity with time resulting from the related art in which the flip angle is not controlled, whereas a curve 112 represents the changes of the signal intensity with time resulting from the method in which the flip angle is controlled according to the first embodiment of the present invention.

As seen from FIG. 4(b), by controlling the flip angle, higher signals can be obtained with all the measurements made within the measurement window in comparison with the case not controlling the flip angle.

Here, as shown in FIG. 2, data regarding the central portion of the k-space is obtained at the time when the concentration of the contrast agent is peaked.

Additionally, by changing the flip angle to appropriate values with the lapse of time, the signal intensity from the other stationary region than the objective blood vessel is also changed depending on the changes of the flip angle. In the contrast-enhanced MRA, however, the differential processing is executed between images before and after the contrast enhancement or images taken at earlier and later points in time is executed, as described above, so that the other tissues than the blood vessel are erased and a differential image including only the blood vessel is obtained. Hence, the changes of the signal intensity from the stationary region are canceled through the differential processing and cause no significant problems.

In fact, because the flip angle is not abruptly changed, the influence caused by the changes of the signal intensity from the stationary region is small from the practical point of view.

In the angiography according to the first embodiment of the present invention, as described above, the flip angle is controlled following the concentration of the contrast agent with TR held fixed so that the flip angle is changed to become the Ernst's angle.

Alternatively, TR may be controlled by changing TR with the flip angle held fixed so that a certain flip angle becomes the Ernst's angle.

In view of the above, in a second embodiment of the present invention, TR is controlled with the flip angle held fixed so that the fixed flip angle becomes the Ernst's angle.

As mentioned above, the higher the concentration of the contrast agent, the shorter is T1. In order to keep the Ernst's angle α constant based on the formula (4), therefore, TR is shortened in match with the shortening of T1 during a period in which the concentration of the contrast agent increases. Conversely, during a period in which the concentration of the contrast agent decreases, since T1 is extended, TR is prolonged in match with the extension of T1.

By changing TR in match with the changes in the concentration of the contrast agent, the signal intensity from the other stationary region than the objective blood vessel is also changed depending on the changes of TR. As in the first embodiment in which the flip angle is changed, however, because the differential processing is executed and TR is not abruptly changed, the influence caused by the changes of the signal intensity from the stationary region is small in practice and cause no problems in the produced image.

FIGS. 5(a) and 5(b) show one example of the signal intensity obtained when TR is controlled following the concentration of the contrast agent according to the second embodiment of the present invention.

FIG. 5(a) shows the changes b(t) in the estimated concentration of the contrast agent in the blood vessel similarly to FIG. 2(a). FIG. 5(b) shows changes of the signal intensity with time, which are resulted when TR is changed following the changes in the concentration of the contrast agent so that a certain flip angle always becomes the Ernst's angle or a value close to it. In FIG. 5(b), the vertical axis represents the TR value, and the horizontal axis represents the time common to the graph of FIG. 5(a).

In FIG. 5(b), a straight line 201 represents the changes of the signal intensity with time resulting from the related art in which TR is not controlled, whereas a curve 202 represents the changes of the signal intensity with time resulting from the method in which TR is controlled according to the second embodiment of the present invention.

As shown in FIGS. 5(a) and 5(b), TR is changed such that TR is gradually shortened following the increasing concentration of the contrast agent during a period Da (t1-t2) in which the concentration of the contrast agent is gradually increased in accordance with a time-dependent change function TR(t) of TR computed based on the formula (4) to keep α constant. During a period Db (t2-t3) in which the concentration of the contrast agent is gradually decreased, TR is gradually prolonged following the decreasing concentration of the contrast agent. Stated another way, the manner of changing TR is modified following the concentration of the contrast agent.

By controlling TR as shown in FIG. 5(b), similar changes of the signal intensity with time to those shown in FIG. 4(b) are obtained. Namely, higher signals can be obtained with all the measurements made within the measurement window. Also in this second embodiment, as shown in FIG. 5(b), data regarding the central portion of the k-space is obtained at the time t2 when the concentration of the contrast agent is peaked.

Practical control of TR is executed by the sequencer 4 shown in FIG. 1. More specifically, as in the first embodiment in which the flip angle is changed, the T1 value of the desired vascular lumen after the contrast enhancement is determined. Then, TR causing a predetermined flip angle to become the Ernst's angle is computed based on the formula (4) by using the determined T1 value, and is informed to the sequencer 4. The sequencer 4 controls the relevant pulse sequence so that the repetition time matches with the determined T1.

While the first and second embodiments have been described above, by way of example, in connection with the case changing the flip angle and TR, respectively, a plurality of imaging parameters may be changed at the same time. For example, during the concentration increasing period until the time at which the concentration of the contrast agent is peaked, the control may be performed to increase the flip angle and shorten TR following the increasing concentration of the contrast agent. On the other hand, during the concentration decreasing period after the time at which the concentration of the contrast agent is peaked, the control may be performed to reduce the flip angle and prolong TR following the decreasing concentration of the contrast agent.

A third embodiment of the present invention will be described below.

This third embodiment is featured in setting a higher concentration period including the time and thereabout at which the concentration of the contrast agent is peaked, and a lower concentration period other than the higher concentration period, and in executing TR control during the higher concentration period and flip angle control during the lower concentration period.

More specifically, because the higher concentration period is a period in which data near the central portion of the k-space is obtained, shorter TR is more preferable to collect a larger number of data. During the higher concentration period, therefore, TR is set shorter than TR in the lower concentration period, and the TR control is executed so that the flip angle becomes the Ernst's angle.

On the other hand, because T1 is prolonged during the lower concentration period, it is possible to ensure a sufficient longitudinal relaxation time and to increase the signal intensity by prolonging TR. During the lower concentration period, therefore, TR is set longer than TR in the higher concentration period, and the flip angle control is executed so that the flip angle α becomes the Ernst's angle. Alternatively, the flip angle may be kept constant during the higher concentration period, and TR may be kept constant during the lower concentration period.

Figure 7:
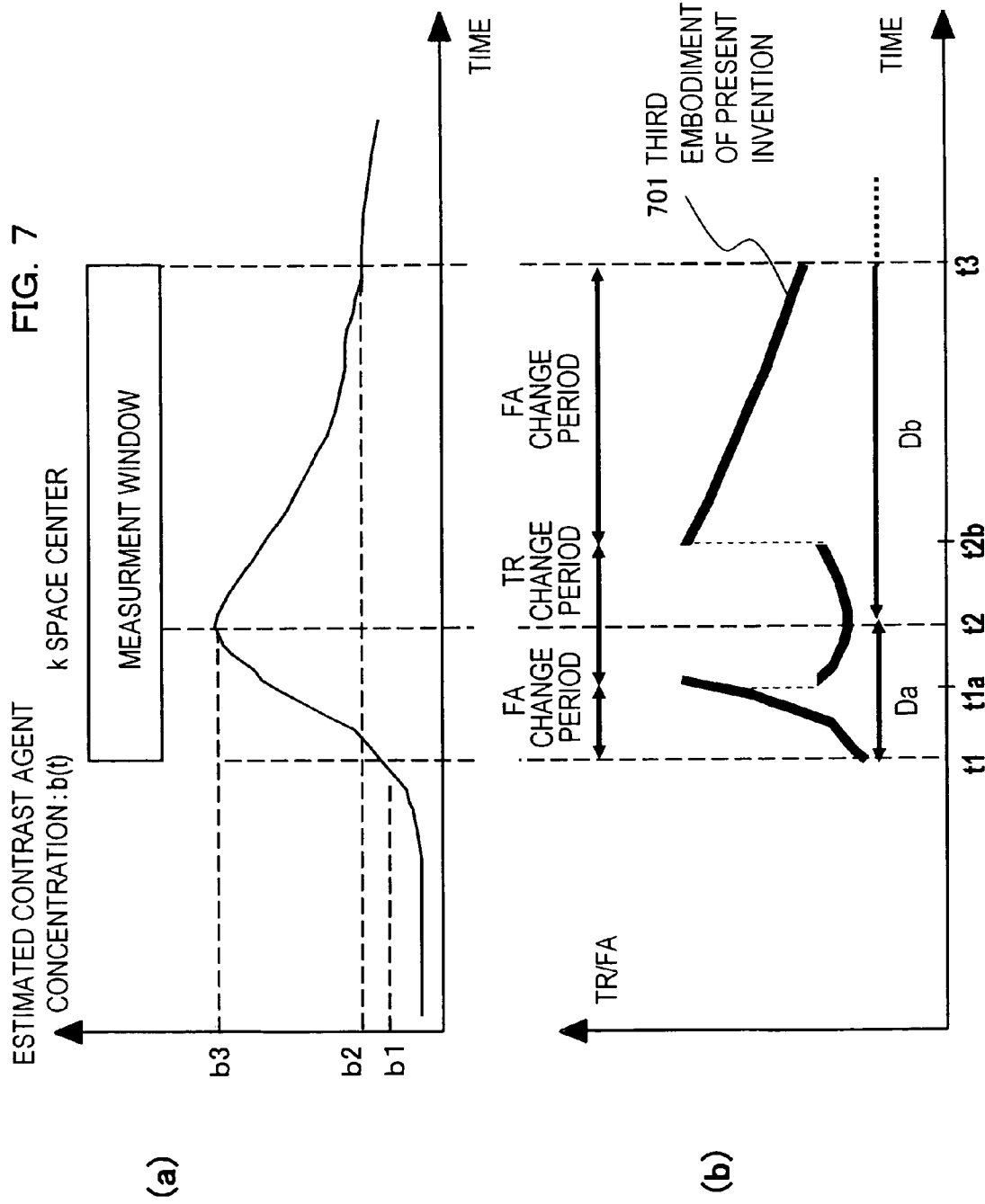
FIG. 7 is a chart for explaining TR and FA control in the contrast-enhanced MRA according to a third embodiment of the present invention.

The third embodiment of the present invention will be described below with reference to FIG. 7. In FIG. 7, the vertical axis represents TR or FA (assuming, in this embodiment, FA to be constant during a TR control period and TR to be constant during a FA control period), and the horizontal axis represents the lapsed time.

During a period from time t1 to t1a in FIG. 7(b), because it corresponds to an earlier lower concentration period, as represented by a curve 701, TR is kept constant and the flip angle is controlled following the concentration of the contrast agent in accordance with α(t) computed based on the formula (4) so that the flip angle becomes the Ernst's angle.

Then, during a period from time t1a to t2b, because it corresponds to the higher concentration period, the flip angle is kept constant and TR is controlled so that the constant flip angle becomes the Ernst's angle.

Further, during a period from time t2b to t3, because it corresponds to a later lower concentration period, TR is kept constant and the flip angle is controlled following the concentration of the contrast agent so that the flip angle becomes the Ernst's angle.

This third embodiment represents one example in which different imaging parameters are changed during the imaging.

Switching between the flip angle control and the TR control can be determined as follows. After a certain period from the start time of the measurement window, the flip angle control is switched over to the TR control. Then, after a predetermined time from that switching, the TR control is switched over to the flip angle control.

Alternatively, a threshold may be set in the estimated concentration of the contrast agent to define, as the higher concentration period, a period in which the estimated concentration is not lower than the threshold, and as the lower concentration period, a period in which the estimated concentration is lower than the threshold. The threshold can be set to, e.g., 80% of the peak value of the estimated concentration of the contrast agent.

Further, it is possible to monitor the signal intensity, to execute the flip angle control until the monitored signal intensity reaches a certain value close to the peak, and to switch over the flip angle control to the TR control at the time when the signal intensity reaches the certain value. Thereafter, the TR control is switched over to the flip angle control at the time when the signal intensity is reduced below the certain value.

While the third embodiment has been described above, by way of example, in connection with the case performing the TR control during the higher concentration period and performing the flip angle control during the lower concentration period, the control may be performed in a reversed manner such that the flip angle control is performed during the higher concentration period and the TR control is performed during the lower concentration period.

In any case, during the higher concentration period, the values of the imaging parameters are changed in opposite directions before and after the time at which the concentration of the contrast agent is peaked. For example, in the case of the TR control, TR is reduced until reaching the peak time, and is increased after the peak time. In the case of the flip angle control, the flip angle is increased until reaching the peak time, and is reduced after the peak time. On the other hand, during the lower concentration period, the values of the imaging parameters are monotonously reduced or increased. For example, in the case of the TR control, TR is reduced during the concentration increasing period before the peak time, and is increased during the concentration decreasing period after the peak time. In the case of the flip angle control, the flip angle is increased during the concentration increasing period before the peak time, and is reduced during the concentration decreasing period after the peak time.

While the third embodiment has been described above, by way of example, in connection with the case controlling one of the flip angle and TR with the other kept constant, values of a plurality of imaging parameters may be changed. For example, during the higher concentration period, the control may be performed to change the value of TR along a downward convex curve and the value of the flip angle along an upward convex curve about the time at which the concentration of the contrast agent is peaked. On the other hand, during the lower concentration period, the control may be performed to increase the flip angle and reduce TR during the concentration increasing period before the peak time, and to reduce the flip angle and increase TR during the concentration decreasing period after the peak time.

In a fourth embodiment of the present invention, the flip angle during the period from time t1$a$ to t2$b$, which corresponds to the higher concentration period, is set to a certain value, and the flip angle during the periods from time t1 to t1$a$ and from time t2$b$ to t3, which correspond to the lower concentration period, is set to another value. Preferably, the flip angle during the higher concentration period is set to a certain value larger than the flip angle during the lower concentration period.

In a fifth embodiment of the present invention, TR during the period from time t1$a$ to t2$b$, which corresponds to the higher concentration period, is set to a certain value, and TR during the periods from time t1 to t1$a$ and from time t2$b$ to t3, which correspond to the lower concentration period, is set to another value. Preferably, TR during the higher concentration period is set to a shorter time than TR during the lower concentration period. Note that the above-described flip angle control may be executed in the state where the flip angle is set in this embodiment.

Further, in the fourth and fifth embodiments of the present invention, the value of the flip angle or TR as a first imaging parameter may be changed in opposite directions to increase and reduce or to shorten and lengthen before and after the time at which the concentration of the contrast agent is peaked, while the value of TR or the flip angle as a second imaging parameter may be monotonously increased or reduced.

Alternatively, the fourth and fifth embodiments may be carried out at the same time such that the flip angle and TR are each set to different constant values during the higher concentration period and the lower concentration period.

As a modification of the first embodiment, it is possible to set TR during the higher concentration period near the peak of the estimated concentration of the contrast agent to be a constant span shorter than TR during the lower concentration period other than the higher concentration period, and to execute the flip angle control all over the period of the measurement window. Conversely, it is also possible to set the flip angle during the higher concentration period to be a constant angle larger than that during the lower concentration period, and to execute the TR control all over the period of the measurement window.

With such a modification, a larger number of data can be obtained during the higher concentration period near the peak of the estimated concentration of the contrast agent.

Figure 8:
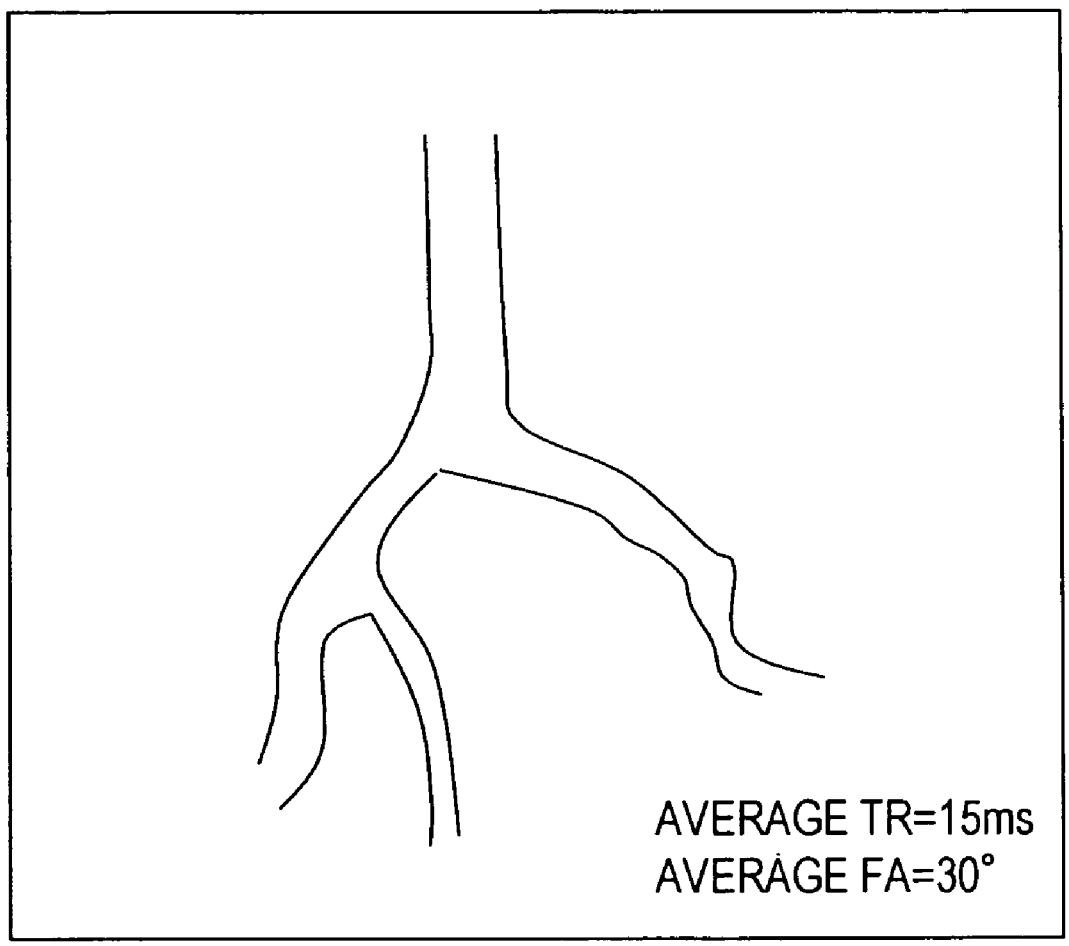
FIG. 8 illustrates an example of display on a screen according to the embodiment of the present invention.

Since the present invention provides the technique of changing TR or the flip angle following the concentration of the contrast agent, the respective values of TR and the flip angle can be displayed on a display screen, as shown in FIG. 8.

In an example shown in FIG. 8, the average value of TR and the average value of the flip angle are displayed along with a blood vessel image taken as described above. In addition to the illustrated display example, any other data of TR and the flip angle can also be displayed, including maximum values, minimum values, most frequent values, and values at the time when the data regarding the central portion of the k-space is measured. Further, plural ones of those values may be displayed in desired combinations.

While the various embodiments have been described above regarding the contrast-enhanced angiography implemented using the magnetic resonance imaging system of the present invention, the present invention is not limited to the matters disclosed in the above-described embodiments and can be modified in other various modes without departing the scope of the present invention.

For instance, as another example for changing values of different imaging parameters during the imaging of the object in accordance with the pulse sequence, TR may be changed during the concentration increasing period until the time when the concentration of the contrast agent is peaked, and the flip angle may be changed during the concentration decreasing period after the time when the concentration of the contrast agent is peaked.

As still another example for modifying the manner of changing the values of the imaging parameters during the imaging of the object, the control may be performed to reduce TR during the earlier lower concentration period, to keep TR constant during the higher concentration period at a final value set in the TR reducing stage, and to increase TR during the later lower concentration period. Alternatively, the control may be performed to increase the flip angle during the earlier lower concentration period, to keep the flip angle constant during the higher concentration period at a final value set in the flip-angle increasing stage, and to reduce the flip angle during the later lower concentration period.

INDUSTRIAL APPLICABILITY

The MRI system according to the present invention can be practiced as not only an MRI system using a vertical magnetic field, but also an MRI system using a horizontal magnetic field.

The invention claimed is:

1. A magnetic resonance imaging system comprising:
    static magnetic field generating means for applying a static magnetic field to an object to be examined;
    gradient magnetic field generating means for applying a gradient magnetic field:
    RF magnetic field transmitting means for irradiating, to nuclear spins within said object, RF magnetic field pulses to cause nuclear magnetic resonance of the nuclear spins;
    an echo signal receiving means for detecting an echo signal emitted by the nuclear magnetic resonance;

pulse sequence control means for controlling a pulse sequence including at least a repetition time TR as an imaging parameter and executed to receive the echo signal;

signal processing means for reconstructing an image of a blood vessel by using the echo signal detected by said echo signal receiving means; and display means for displaying said blood vessel image, wherein, during execution of said pulse sequence, said pulse sequence control means changes a value of the at least said repetition time TR in said pulse sequence depending on a concentration profile of a contrast agent, such that the repetition time has a shorter value during a higher concentration period than a value during a lower concentration period, which has been injected into said object, in said blood vessel.

2. The magnetic resonance imaging system according to claim 1, wherein said signal processing means estimates the concentration of the contrast agent based on information regarding changes in the concentration of the contrast agent, the information being obtained in advance, and said pulse sequence control means changes the value of said repetition time and takes said blood vessel image in accordance with a predicted value of the concentration of the contrast agent.

3. The magnetic resonance imaging system according to claim 2, further comprising an input unit for receiving an input to instruct start of the imaging of said blood vessel image, wherein said pulse control means successively takes monitoring images including said blood vessel, said display means successively displays said monitoring images, and said pulse sequence control means switches over the imaging from said monitoring images to said blood vessel image in accordance with the start instruction.

4. The magnetic resonance imaging system according to claim 1, further comprising contrast agent injecting means, said contrast agent being injected by said contrast agent injecting means.

5. The magnetic resonance imaging system according to claim 1, wherein said pulse sequence control means sets a first period and a second period depending on the concentration of the contrast agent, and said imaging parameter has different values during said first period and said second period, respectively.

6. The magnetic resonance imaging system according to claim 5, wherein said pulse sequence control means selects at least two imaging parameters including said repetition times, and a different imaging parameter is selected for said first period and said second period, respectively.

7. The magnetic resonance imaging system according to claim 6, wherein said pulse sequence control means changes a value of a first imaging parameter during said first period, and a value of a second imaging parameters is changed during said second period.

8. The magnetic resonance imaging system according to claim 7, wherein said first period is a higher concentration period in which the concentration of the contrast agent is not lower than a threshold, including the time at which the concentration of the contrast agent is peaked, and said second period is a lower concentration period in which the concentration of the contrast agent is lower than the threshold.

9. The magnetic resonance imaging system according to claim 8, wherein said pulse sequence is a gradient echo pulse sequence including a flip angle and said repetition time as said imaging parameters, said first imaging parameter is one of the flip angle and the repetition time, and said second imaging parameter is the other, said pulse sequence control means sets the flip angle such that the flip angle has a larger value during said higher concentration period than a value during said lower concentration period, and said pulse sequence control means sets the repetition time.

10. The magnetic resonance imaging system according to claim 9, wherein said pulse sequence control means changes the value of said first imaging parameter in opposite directions before and after the peak time, monotonously increasing or reducing the value of said second imaging parameter.

11. The magnetic resonance imaging system according to claim 10, wherein said pulse sequence control means changes the flip angle such that the flip angle becomes an Ernst's angle, changing the repetition time such that the flip angle becomes an Ernst's angle.

12. The magnetic resonance imaging system according to claim 9, wherein said pulse sequence control means changes the flip angle such that the flip angle becomes an Ernst's angle, changing the repetition time such that the flip angle becomes an Ernst's angle.

13. The magnetic resonance imaging system according to claim 5, wherein said first period is a concentration increasing period until a time at which the concentration of the contrast agent is peaked, and said second period is a concentration decreasing period after the time at which the concentration of the contrast agent is peaked.

14. The magnetic resonance imaging system according to claim 13, wherein said pulse sequence is a gradient echo pulse sequence including a flip angle and said repetition time as said imaging parameters, said pulse sequence control means changes a value of at least one of the flip angle and the repetition time, the flip angle is increased following a concentration increase during said concentration increasing period and reduced following a concentration decrease during said concentration decreasing period, and the repetition time is reduced following the concentration increase during said concentration increasing period and increased following the concentration decrease during said concentration decreasing period.

15. The magnetic resonance imaging system according to claim 14, wherein said pulse sequence control means changes the flip angle such chat the flip angle becomes an Ernst's angle, changing the repetition time such that the flip angle becomes an Ernst's angle.

16. The magnetic resonance imaging system according to claim 1, wherein said displaying means displays statistic values obtained based on values resulting from changing the value of said imaging parameters.

17. The magnetic resonance imaging system according to claim 1, wherein said pulse sequence control means obtains data regarding a central portion of a k-space near a time at which the concentration of the contrast agent is peaked.

18. The magnetic resonance imaging system according to claim 1, wherein said pulse sequence control means repeats said pulse sequence to obtain at least two images, and said blood vessel image is obtained from difference between said two images.

19. The magnetic resonance imaging system according to claim 1, wherein said pulse sequence control means obtains information regarding changes in the concentration of the contrast agent in said blood vessel, changing the value of said imaging parameter in accordance with the concentration change information.

20. The magnetic resonance imaging system according to claim 1, wherein said pulse sequence control means successively takes monitoring images of said desired region including said blood vessel when a signal representing information regarding the concentration of the contrast agent in said blood vessel is extracted from said monitoring images and said extracted signal exceeds a predetermined value.

21. The magnetic resonance imaging system according to claim 1, wherein said pulse sequence control means changes values of different kinds of imaging parameters during the imaging.

22. The magnetic resonance imaging system according to claim 1, wherein said pulse sequence control means modifies a manner of changing the value of said imaging parameter during the imaging.

\* \* \* \* \*